United States Patent
Lincot

(10) Patent No.: US 10,886,425 B2
(45) Date of Patent: Jan. 5, 2021

(54) TANDEM PHOTOVOLTAIC CELL

(71) Applicants: Centre national de la recherche scientifique, Paris (FR); INSTITUT PHOTOVOLTAÏQUE D'ILE DE FRANCE (IPVF), Antony (FR); TOTAL SA, Courbevoie (FR); ELECTRICITE DE FRANCE, Paris (FR); RIBER, Bezons (FR)

(72) Inventor: Daniel Lincot, Antony (FR)

(73) Assignees: Centre national de la recherche scientifique, Paris (FR); INSTITUT PHOTOVOLTAÏQUE D'ILE DE FRANCE (IPVF), Antony (FR); TOTAL SA, Courbevoie (FR); ELECTRICITE DE FRANCE, Paris (FR); RIBER, Bezons (FR)

( * ) Notice: Subject to any disclaimer, the term of this patent is extended or adjusted under 35 U.S.C. 154(b) by 0 days.

(21) Appl. No.: 16/047,330

(22) Filed: Jul. 27, 2018

(65) Prior Publication Data

US 2019/0035964 A1   Jan. 31, 2019

(30) Foreign Application Priority Data

Jul. 28, 2017  (FR) .................................... 17 57234

(51) Int. Cl.
*H01L 31/0725* (2012.01)
*H01L 31/074* (2012.01)
(Continued)

(52) U.S. Cl.
CPC ....... *H01L 31/0725* (2013.01); *H01G 9/2009* (2013.01); *H01G 9/2072* (2013.01);
(Continued)

(58) Field of Classification Search
CPC .......... H01L 31/0725; H01L 31/02008; H01L 31/022425; H01L 31/0296; H01L 31/0304;
(Continued)

(56) References Cited

U.S. PATENT DOCUMENTS 5,261,969 A      11/1993 Stanbery
2007/0175507 A1*  8/2007 Dutta .............. H01L 31/035209
                                                      136/255
(Continued)

FOREIGN PATENT DOCUMENTS

WO    2007034228 A2    3/2007
WO    2008108990 A1    9/2008
(Continued)

OTHER PUBLICATIONS

Preliminary Search Report dated Jun. 6, 2018 during the prosecution of French Patent Application No. FR 1757234.

*Primary Examiner* — Jayne L Mershon
(74) *Attorney, Agent, or Firm* — Troutman Pepper Hamilton Sanders LLP

(57) ABSTRACT

The present invention relates to a multi-layer material comprising an assembly of layers, called "front layers", capable of forming a front photovoltaic cell, and an assembly of layers, called "rear layers", capable of forming a rear photovoltaic cell, wherein the front layer assembly and the rear layer assembly are electrically insulated by an insulating layer of epitaxial material.

22 Claims, 3 Drawing Sheets

(51) Int. Cl.
*H01L 31/0224* (2006.01)
*H01L 31/0304* (2006.01)
*H01L 31/0296* (2006.01)
*H01L 31/032* (2006.01)
*H01L 31/18* (2006.01)
*H01L 51/42* (2006.01)
*H01G 9/20* (2006.01)
*H01L 31/02* (2006.01)
*H01L 31/078* (2012.01)
*H01L 51/00* (2006.01)
*H01L 31/0256* (2006.01)

(52) U.S. Cl.
CPC .... *H01L 31/02008* (2013.01); *H01L 31/0296* (2013.01); *H01L 31/022425* (2013.01); *H01L 31/0304* (2013.01); *H01L 31/0322* (2013.01); *H01L 31/074* (2013.01); *H01L 31/078* (2013.01); *H01L 31/18* (2013.01); *H01L 51/4253* (2013.01); *H01L 51/0077* (2013.01); *H01L 2031/0344* (2013.01)

(58) Field of Classification Search
CPC . H01L 31/0322; H01L 31/074; H01L 31/078; H01L 31/18; H01L 51/4253; H01G 9/2009; H01G 9/2072
See application file for complete search history.

(56) References Cited

U.S. PATENT DOCUMENTS

| | | | |
|---|---|---|---|
| 2008/0230112 A1* | 9/2008 | Barnham | H01L 31/061 136/249 |
| 2009/0084425 A1* | 4/2009 | Milshtein | H01L 31/072 136/244 |
| 2012/0180854 A1* | 7/2012 | Bellanger | H01L 31/0687 136/255 |
| 2014/0360554 A1* | 12/2014 | Feist | H01L 31/0463 136/245 |

FOREIGN PATENT DOCUMENTS

| WO | 2009047448 A1 | 4/2009 |
|---|---|---|
| WO | 2017093695 A1 | 6/2017 |
| WO | 2017105248 A1 | 6/2017 |

* cited by examiner

TANDEM PHOTOVOLTAIC CELL

CROSS-REFERENCE TO RELATED APPLICATIONS

The present application claims priority from French Patent Application No. 1757234 filed Jul. 28, 2017. The entire contents of which are incorporated herein by reference.

FIELD OF THE INVENTION

The present invention relates to the field of photovoltaic cells. In particular, the present invention relates to photovoltaic cells comprising a vertical stacking of two photovoltaic cells, also referred to as tandem photovoltaic cells.

BACKGROUND

Solar cells with a double junction (tandem) are considered to be the next step in the industrial development of photovoltaic technology, relying on the currently most developed technology based on crystalline silicon cells. The silicon cell would then become the rear cell of the tandem cell, capturing the infrared range of the solar spectrum, while another cell, referred to as the front cell, would be placed above to capture the complementary visible and UV domains. Several types of architectures are part of the prior art, and are illustrated in the case of cells where the front cell is a type III-V cell.

The first type of architecture considered is that of the mechanical relationship of the type III-V cell on the silicon cell, wherein the contacts are already placed on each of the cells. When the intermediate contacts communicate, the resulting contacts for the tandem cell are the two front and rear contacts in a so-called two-wire configuration. If the two cells are electrically isolated then the four contacts must be used in a so-called four-wire configuration. Another architecture is where the transfer between the two cells is effected directly between the outer layers of the cells with an intimate contact at the atomic level which allows the current to flow without the contacts arranged as in the first case. A third configuration does not use the mechanical transfer technique, but rather the direct growth of a III-V junction on a silicon junction in epitaxial form, or not for other types of front cells. From an electrical point of view, both cells are in direct electrical contact at the growth interface. It is therefore a two-wire electrical configuration. Similar prior art is found for the other types of cells considered above, with predominantly 2-wire structures and four-wire cells with mechanical transfer.

The solutions currently proposed are also to manufacture front single cells, in particular III-V, covering the entire silicon cell. Electrically, the configuration would correspond to that known as the 2-wire connection, wherein the two junctions are connected in series and linked together by a tunnel structure. In this configuration, the silicon cell is necessarily a cell where the n and p zones are located on either side of the silicon wafer, which precludes a priori the use of interdigitated back contact cells, which are nevertheless more efficient in terms of yields.

The patent application WO 2017/093695 describes a photovoltaic cell with 3 contacts. Such cells make it possible, for example, to pass electrons (n-type carriers) from the first layer to the second layer, to collect them from the set of first and second layers by the first electrodes, to collect the holes (carriers of type p) from the first layer by the second electrodes, and to collect the electrons from the second layer by the third electrodes. This architecture is not entirely monocrystalline since it is advisable to use an amorphous junction of hydrogenated silicon, silicon oxide or an amorphous silicon carbide alloy. Furthermore, this application WO 2017/093695 recommends a manufacturing technique other than epitaxy. This photovoltaic cell with 3 contacts has, like a photovoltaic cell with 2 contacts, the need to conduct the current between the two cells. The two cells are not electrically isolated.

There is also the patent application WO 2009/047448 and its family which concern an epitaxial method without the difference in the meshing parameter of layers of different monocrystalline materials. This application mainly relates to applications in microelectronics and optoelectronics such as LEDs, but does not relate to any specific application such as photovoltaic cells.

The tandem photovoltaic cells make it possible to envisage theoretical photovoltaic yields greater than 40%. This may be translated into practice by modules with yields higher than 30%. It may be noted that the architectures considered for the silicon cells implement contacts on either side of the cell as is the case for conventional cells of the PERC, PERL type. However, it appears that the highest yield cells currently on the market are so-called interdigitated back contact cells, introduced under the name IBC (interdigitated back contacts), in particular by the company Sunpower. Recently a convergence has emerged with heterojunction structures introduced by Sanyo, with the introduction of the IBC concept for these cells that led to a record yield of 26.6%. Thus silicon cells are the cells currently most used by the market.

SUMMARY

The invention aims to solve the technical problem involved in providing a photovoltaic cell.

In particular, the present invention aims to solve the technical problem of providing a tandem photovoltaic cell, and, in particular, using a lower photovoltaic cell of monocrystalline silicon.

Even more particularly, the present invention aims to solve the technical problem of providing a tandem photovoltaic cell having a vertical stacking of a silicon cell and a type III-V chalcogenide cell, in particular families of copper, indium and gallium selenide (denoted CIGS) and cadmium telluride (CdTe), or of the perovskite ($PbNH_4I_3$) type.

An aim of the invention is to solve the technical problem of providing a tandem photovoltaic cell with a stacking of crystalline layers, and preferably monocrystalline main active layers.

The invention aims to solve the technical problem of providing a tandem photovoltaic cell with a so-called monolithic connection architecture of the upper junction.

The invention also aims to solve the technical problem of providing a tandem photovoltaic cell with a monocrystalline silicon photovoltaic cell with back contacts, on the front of which is stacked a cell with a monolithic connection junction, and, for example, a type III-V, chalcogenide (CIGS, CdTe), or perovskite junction.

The invention also aims to solve the technical problem of providing a 4-wire tandem photovoltaic cell.

The invention also aims to solve one or more of the technical problems presented by the invention on an industrial scale, preferably by limiting production costs.

DETAILED DESCRIPTION

Figure 1:
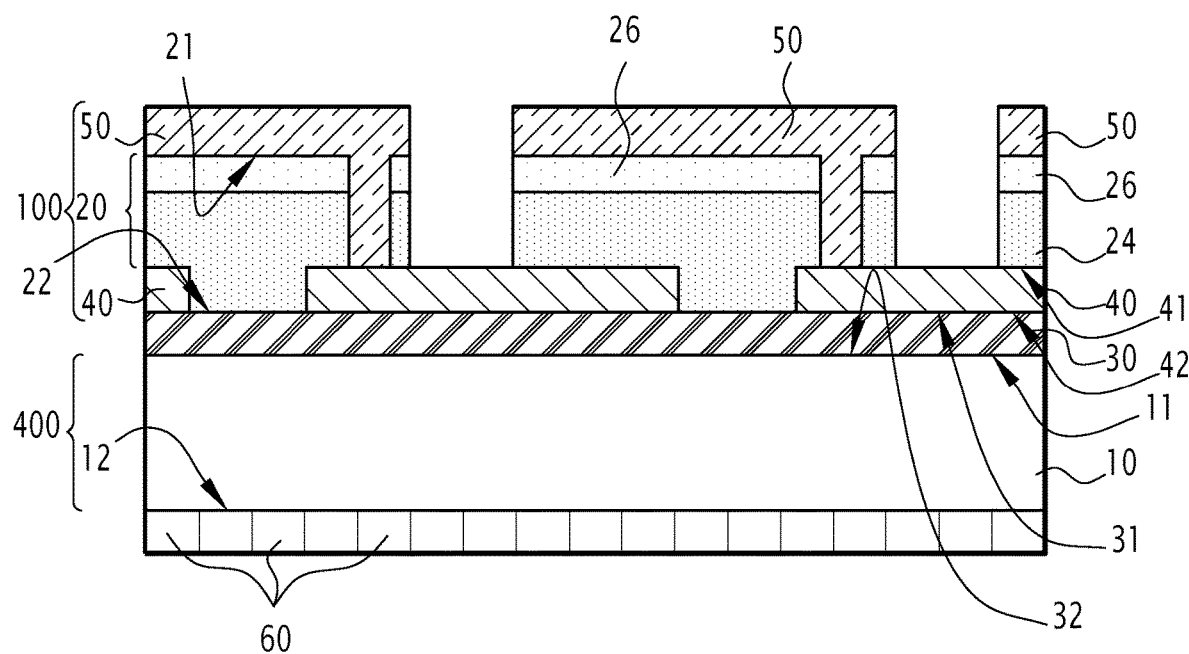
FIG. 1 schematically shows a section of a multi-layer material according to an embodiment of the present invention.

The present invention relates, in particular, to a multi-layer material 1 comprising:
(i) an assembly of layers, called "front layers" 100, capable of forming a front photovoltaic cell and
(ii) an assembly of layers, called "rear layers" 400, capable of forming a rear photovoltaic cell,
wherein the front layer assembly 100 and the rear layer assembly 400 are electrically insulated by an insulating layer 30 of epitaxial material.

According to one embodiment, the front layer assembly 100 comprises at least one combination of layers forming a heterojunction 20 comprising a first material 24 and a second material 26, a rear contact layer 40 of the heterojunction 20, and a front contact layer 50.

Preferably, the rear layer assembly 400 comprises at least monocrystalline material 10, typically monocrystalline silicon, and preferably interdigitated contact electrodes 40.

The present invention relates to a tandem photovoltaic cell comprising a silicon photovoltaic cell, as a rear junction, comprising a monocrystalline silicon layer with rear interdigitated contacts and an epitaxial insulating layer on the front face, and, as the front junction, a heterojunction, preferably comprising one or more epitaxial layers.

An epitaxial layer may be more or less homogeneous in composition and may, for example, comprise one or more composition gradients.

Preferably, the front junction is structured alternately with (i) conductive areas forming the front and back contacts of the front junction, and with (ii) insulating zones, wherein the alternating zones allowing lateral conduction between the front and back contacts of the front junction. This is referred to as an interconnection or monolithic connection.

Typically, the alternation of conductive and insulating zones forms strips, preferably rectilinear and parallel, preferably of a repetitive nature.

According to one embodiment, the invention relates to a multi-layer material 1 comprising:
(i) a layer of at least one monocrystalline material having a front face 11 and a rear face 12;
(ii) a combination of heterojunction layers 20 comprising a first material 24 and a second material 26, wherein the heterojunction 20 comprises a front face 21 and a rear face 22;
(iii) a layer 40, comprising a front face 41 and a rear face 42, referred to as the back contact of the heterojunction 20, wherein the front face 41 is in contact with the rear face 22 of the heterojunction 20,
(iv) an electrically-insulating layer 30 having a front face and a rear face, wherein the electrically-insulating layer 30 is arranged between the rear face 42 of the rear layer 40 of the heterojunction 20 and the front face 11 of the monocrystalline material 10;
wherein the electrically-insulating layer 30 is in alternating front-side contact 31 with the back contact layer 40 of the heterojunction 20 and the rear face 22 of the heterojunction 20 or an insulating material 90.

Thus, advantageously, the multi-layer material 1 comprises in the rear layer assembly 400: the layer of at least one monocrystalline material 10, and, in the front layer assembly 100: the combination of layers forming a heterojunction 20 and the back contact layer 40 of the heterojunction 20.

The present invention is described with reference to the figures which make it possible to illustrate embodiments without limiting the general teaching of the invention described in the present description.

Among the cells considered above, are cells based on III-V materials, respectively combining elements of the column of gallium and arsenic, cells based on I-III-VI$_2$ type chalcogenide compounds associating the elements of the columns of copper, indium, sulfur or selenium, cells also known as chalcogenides, based on compounds II-VI of the CdTe type, and, finally, recently emerging cells based on inorganic organic hybrid materials of the perovskite (PbNH$_4$I$_3$) type.

Thus, the invention relates in particular to Si architecture structures/III-V/(CIGS, CdTe or perovskite) layers. The interface layer III-V advantageously plays the role of an epitaxial facilitator for these layers, and which is able to improve their properties with a view to the tandem application.

Monocrystalline Material

Typically, the monocrystalline material 10 is the wafer of the rear photovoltaic cell. Reference may also be made to a monocrystalline substrate 10.

Preferably, the monocrystalline material 10 comprises or consists of monocrystalline silicon. Advantageously, the monocrystalline silicon may comprise doped zones, and preferably differently doped zones.

Typically, the thickness of the monocrystalline material layer 10 is from 50 to 300 μm, and, generally, from 100 to 200 μm.

According to one variant, the rear face 12 comprises interdigitated contact electrodes 40.

For example, the monocrystalline material 10 has on its rear face 12 at least one layer of back contacts 60 in the form of conductive strips, generally separated by a distance of a few hundred microns or a few millimeters. Typically, the conductive strips of opposite polarities have a width generally of the order of 0.5 to 5 mm. The interdigitated electrodes may be deposited before or after the production of the multi-layer material of the invention. They are generally deposited after the growth of the epitaxial layers.

According to one embodiment, the back contact layer 60 may be continuously deposited and then structured, for example by photolithography and etching, before being reintroduced into an epitaxial chamber.

Advantageously, the particularity of the monocrystalline material is to preserve a monocrystalline character over all its surface, in particular its front surface, allowing epitaxial growth of materials of the front junction of the tandem cell, for example of the III-V, chalcogenide (CIGS, CdTe) or perovskite type.

Preferably, the monocrystalline material 10 and interdigitated contact electrodes 40 on the rear face 12 form a first photovoltaic cell, preferably a silicon cell.

According to one variant, the rear cell forms a silicon cell with a rear face.

Insulating Layer

Advantageously, the present invention makes it possible to obtain the best performance of the photovoltaic cells by combining the monocrystalline character of the monocrystalline material of the rear junction 300 and the front junction 200, while being electrically independent of one another.

By "insulating layer" is meant an electrically-insulating layer so that the front junction 200 is electrically independent of the rear junction 300 and vice versa.

According to one embodiment, the front photovoltaic cell and the rear photovoltaic cell have independent electrical connectors 500.

Advantageously, the insulating layer 30 is monocrystalline.

Advantageously, the insulating layer 30 is epitaxial.

As is known to those skilled in the art, the front surface 11 of the monocrystalline material 10 must be of sufficient quality to allow epitaxial growth.

According to one variant, the insulating layer 30 comprises or consists of aluminum nitride (AlN) and/or aluminum phosphide (AlP) and/or gallium phosphide (GaP) and/or a mixture of aluminum phosphide and gallium phosphide ((Al,Ga)P), and/or a mixture of aluminum nitride and gallium nitride ((Al,Ga)N).

Preferably, the insulating layer (30) comprises or consists of aluminum nitride (AlN) and/or aluminum phosphide (AlP), and/or any of the alloys comprising AlN or AlP, or oxides, such as, for example, $Gd_2O_3$, $Al_2O_3$ and $(Ba,Sr)TiO_3$.

According to one embodiment, the insulating layer 30 is not a monocrystalline oxide.

According to one embodiment, the insulating layer 30 is a monocrystalline oxide, for example the insulating layer 30 comprises or consists of aluminum oxide.

According to one variant, the insulating layer (30) comprises or consists of compound oxides based on aluminum, titanium, zirconia and gadolinium. Of these, $Gd_2O_3$, $Al_2O_3$ and $(Ba,Sr)TiO_3$ may, in particular, be mentioned.

According to one variant, the insulating layer 30 is formed by chemical vapor deposition (CVD), molecular beam epitaxy (MBE) or plasma-enhanced chemical vapor deposition (PECVD).

Typically, the thickness of the insulating layer 30 ranges from 0.1 to 5 μm, and, generally, from 0.1 to 1 μm.

Heterojunction

According to one variant, the front junction 200 is a III-V heterojunction.

According to one variant, the front junction 200 is a chalcogenide heterojunction (CIGS).

According to one variant, the front junction 200 is a heterojunction of the kesterite (CZTS) or cadmium telluride (CdTe) type, or other multinary inorganic semiconductor, for example of the phosphide, arsenide or halide type.

According to one embodiment, the heterojunction comprises, or consists, vertically of III-V or CIGS (Cu,Ag)(In, Ga,Al),(S,Se)₂) type semiconductor compounds, and, preferably, a horizontal alternation of type III-V semiconductor compounds, combined or not with CIGS.

"I-III-(VI)₂" means a combination of materials from the columns of elements I and III and VI.

It may be, for example, a compound of the (Cu, Ag)(In, Ga,Al),(S,Se)₂) type.

Preferably, the heterojunction comprises an epitaxial heterojunction, for example of the III-V or I-III-VI-II type.

Advantageously, the front heterojunction has a monolithic type structure.

According to one embodiment, the first material 24 and the second material 26 are connected in series in a monolithic manner.

According to one variant, the heterojunction comprises or consists of different types of heterojunctions.

According to one variant, the front junction 200 comprises, or consists of, a first material 24 and a second material 26.

According to one variant, the first material 24 comprises or consists of a type III-V or CIGS compound.

According to one variant, the second material 26 comprises, or consists of, a III-V, Zn(S,O) or CdS type compound.

Preferably, the second material 26 comprises, or consists of, a III-V type compound when the first material 24 is a III-V compound.

Preferably, the second material 26 comprises, or consists of, Zn(S,O) or CdS when the first material 24 is CIGS.

According to one variant, at least either the first material 24 or the second material 26 comprises, or consists of, a III-V type compound chosen from GaInP, GaAlAs, and any one of their combinations.

According to one variant, at least either the first material 24 or the second material 26 is formed by PVD, CVD or a deposition from solutions (DS), for example by electrodeposition (ED).

Preferably, when the first material 24 comprises, or consists of, CIGS, the deposition is effected by PVD, DS (ED) or CVD.

Preferably, when the first material 24 and/or the second material 26 comprises, or consists of, a III-V type compound, the deposition is effected by CVD or MBE.

Typically, the thickness of the layer of the first material 24 is from 0.5 to 3 μm, and, generally, from 1 to 2 μm.

Typically, the thickness of the layer of the second material 26 is from 0.1 to 3 μm, and, generally, from 0.5 to 2 μm.

Typically, the width of an insulating zone (p2, p3), typically of an insulating strip, between two semiconductor zones of the first material 24 and/or the second material 26, ranges from 5 to 40 μm, and, generally, from 15 to 25 μm, and is, for example, 20 μm.

Typically, the heterojunction 20 is rather a back contact P (first material 24) and front contact N (second material 26) but the opposite is also possible. This only relates to a choice of electrical connection that may be easily settled.

Rear Contact Layer 40

Typically, the front junction 200 comprises a back contact layer 40 on the rear face.

According to one variant, the back contact layer 40 comprises, or consists of, gallium nitride (GaN) or gallium phosphide (GaP) or any combination thereof, with other elements of columns III and V. Their electrical properties may be, for example, fixed by doping with n-type or p-type doping elements according to the prior art.

According to one variant, the rear contact layer 40 is formed by CVD, PECVD, or MBE.

Typically, the thickness of the rear contact layer 40 ranges from 0.1 to 3 μm, and in general from 0.5 to 1 μm.

Typically, the width of a conductive zone of the back contact layer 40 between two insulating zones (p1), i.e. typically two insulating strips, ranges from 3 to 10 mm, and, generally, from 5 to 8 mm.

Typically, the width of an insulating zone (p1), i.e. typically an insulating strip, between two conductive zones of the back contact layer 40, is from 5 to 40 μm, and, in general, from 10 to 20 μm.

Front Contact Layer 50

Typically, the front junction 200 comprises a front contact layer 50 on the front face.

Typically, the multi-layer material 1 according to the invention comprises:

(iv) a photon-transparent conductive layer 50 on the front side 21 of the heterojunction 20.

Typically, the front contact layer 50 comprises, or consists of, a transparent conductive material, and typically a transparent conductive oxide (TCO) layer.

Preferably, the front contact layer 50 comprises or consists of doped zinc oxide (ZnO), tin oxide and indium oxide (indium-tin oxide (ITO)), or any one of their combinations.

Preferably, the front contact layer 50 is effected by PVD, DS (ED) or CVD.

Typically, the thickness of the front contact layer 50 is from 0.5 to 3 µm, and, generally, from 1 to 2 µm.

Typically, the width of an insulating zone (p3), i.e. typically an insulating strip, between two zones of the front contact layer 50, is from 5 to 40 µm, and, generally, from 15 to 25 µm, and is, for example, 20 µm.

Advantageously, the heterojunction is structured by an alternation of the layers so that the layer of the first material 24 and the back contact layer 50 are in contact alternately with the back contact layer 40. Thus, the electrical conduction takes place between the adjacent conductive areas in a lateral manner by alternating the conduction between the front and back contact layers forming series conduction of the front photovoltaic cell.

The present invention makes it possible to form a front junction with a monolithic type interconnection, which is well known for the placing in modules of thin layer cells of the CIGS CdTe and amorphous silicon type, and to associate it with a silicon structure in order to combine the advantages of these two types of cells. The front photovoltaic cell may be considered as a photovoltaic minimodule.

The present invention makes it possible to produce a structure that is both stacked vertically (vertical tandem cell) and horizontally (conductive interzones, typically interstrip) and photovoltaic inter-cells before each stage on either side of the insulating layer 30).

The present invention makes it possible to produce a structure whose assembly of front layers 100 leads to a front cell absorbing photons with a wavelength less than approximately 800 nm and transparent to photons of a higher wavelength, in order to allow their absorption by the rear cell, typically silicon. This translates into energy by a front cell characterized by a forbidden band gap energy of about 1.6-1.8 eV.

According to one embodiment, the insulating layer 30 is transparent for optimum operation of the rear photovoltaic cell. For example, an insulating layer 30 must be transparent for energy photons lower than the forbidden band gap of the front cell, i.e. 1.6-1.8 eV, and up to the forbidden band gap energy of the rear cell, typically silicon, of 1.12 eV, so that it may efficiently convert photons between these two limits.

Specific Material

According to one variant, the multilayer material 1 comprises a vertical stack of a silicon cell, wherein the silicon layer forms the monocrystalline material layer 10 and a cell with a heterojunction 20, preferably of the III-V, chalcogenide (CIGS, CdTe) or perovskite type, with a back contact layer 40 made of a III-V material, preferably based on GaN or GaP.

According to one variant, the combination of monocrystalline material layers 10, the heterojunction-forming layers 20, the electrically-insulating layer 30, and optionally the intermediate layer(s) between these layers, form a combination of monocrystalline, and preferably entirely monocrystalline, layers.

Advantageously, according to one variant, the first material 24 and the second material 26 are epitaxial of the III-V type on silicon (monocrystalline material 10) with an epitaxial insulating layer 30 between the silicon 10 and the first material 24, and, more particularly, between the silicon 10 and the back contact layer 40. The second material 26 may form a buffer layer and may be deposited by a technique other than epitaxy, as known to those skilled in the art (especially for a Zn(O,S) or CdS layer, for example).

Advantageously, according to one variant, the multi-layer material 1 forms, in whole or in part, a tandem cell with four wires or four electrical contacts, associating a back contact silicim monolith and a photovoltaic minimodule on the front face.

According to one variant, the multi-layer material 1 comprises the sequence, in direct contact or not, of the following layers:

Insulating layer 30: $(Al_x,Ga_{(1-x)})R$, where x is 0 to 1 or $(Al_x,Ga_{(1-x)})N$, where x is 0 to 1;

Rear contact layer 40: GaN or GaP;

Layer of first material 24: III-V ((GaInP or GaAlAs, for example);

Layer of second material 26: III-V ((GaInP or GaAlAs, for example);

Front contact layer 50: ITO or ZnO

According to one variant, the multi-layer material 1 comprises the sequence of the following layers, in direct contact or not:

Insulating layer 30: $(Al_x,Ga_{(1-x)})R$, where x is 0 to 1, $(Al_x,Ga_{(1-x)})N$, where x is 0 to 1;

Rear contact layer 40: GaN or GaP;

Layer of first material 24: CIGS;

Layer of second material 26: Zn(O,S) or CdS, for example;

Front contact layer 50: ITO or ZnO

According to one variant, the multi-layer material 1 comprises the sequence of the following layers, in direct contact or not: Si/AlN/GaN/CIGS/TCO.

According to one variant, the multi-layer material 1 comprises the sequence of the following layers, in direct contact or not: Si/AlP/GaP/CIGS/TCO.

According to one variant, the CdTe material or its alloys (for example with sulfur, selenium, zinc, magnesium), or perovskites replace the CIGS in the previous configurations. The upper layers necessary to complete the front cell are those that are specific to these cells according to the prior art.

According to one variant, the multi-layer material 1 comprises the sequence, in direct contact or not, of the following layers: III-V/(Cd,Zn)(S,Se)/(Cd,Zn)Te/TCO.

Advantageously, these materials make it possible to match the meshing parameter differences when necessary.

Advantageously, these materials make it possible to match the optical and structural correspondence of the materials, when necessary.

Advantageously, these materials make it possible to match the electronic correspondence of the materials, when necessary.

Preferably, the insulating layer 30 is grown epitaxially on the monocrystalline material 10, typically monocrystalline silicon.

Preferably, for a type III-V cell: the GaInP or GaAlAs layers are grown epitaxially on the insulating layer of AlN or AlP, that is itself epitaxially grown.

The electrical contacts may typically be made once the semiconductor layers of the multilayer material 1 are complete.

A tandem photovoltaic cell is thus formed with a rear back contact photovoltaic cell and a front front-contact photovoltaic cell, wherein the photovoltaic cells are electrically independent.

For example, the rear face of the rear junctions 300 may be electrically connected by electrical contacts in series with each other.

For example, it is possible to electrically connect in series with each other the front face of front junctions 200 with electrical contacts.

This gives two networks in series one above the other and electrically isolated from each other.

Typically, the layers of multilayer material 1 according to the invention are stacked vertically and are in direct contact with each other, and optionally spaced apart by one or more intermediate layers.

Method

The invention also relates to a method of manufacturing a multi-layer material 1 as defined according to the invention.

According to one variant, the method consecutively comprises:
(i) preparing a monocrystalline material having a front face 11 and a rear face 12;
(ii) deposition or growth of an electrically-insulating layer 30 on the front face 11 of the monocrystalline material 10, wherein the insulating layer 30 has a front face 31 and a rear face 32;
(iii) the deposition or the growth on the front face 31 of the insulating layer 30 of a layer 40, comprising a front face 41 and a rear face 42, referred to as the back contact of a heterojunction 20, wherein the front face 41 is in contact with the rear face 22 of the heterojunction 20;
(iv) deposition or growth on the front face 41 of the back contact layer 40 of a layer of a first material 24 of a heterojunction 20, and the deposition or growth of a layer of a second material 26, wherein the heterojunction 20 comprises a front face 21 and a rear face 22;
(v) the structuring P1 of zones, referred to as first insulating zones p1, isolating conductive regions of the back contact layer 40, the structuring P1 forming front-side alternating contacts 31 of the electrically-insulating layer 30 with the rear layer 40 of the heterojunction 20 and the rear face 22 of the heterojunction 20; wherein the structuring P1 preferably occurs before or after the deposition or growth of the first material 24 and the second material 26;
wherein the electrically-insulating layer 30 is arranged between the rear face 42 of the back contact layer 40 of the heterojunction 20 and the front face 11 of the monocrystalline material 10.

According to one variant, the method comprises:
(vi) the structuring P2 of zones, referred to as the second insulating zones p2, i.e. the isolating semiconductor zones of the heterojunction 20;
wherein the first p1 and second p2 insulating zones are not superimposed in the vertical stack of layers of the multilayer material 1.

According to one variant, the method comprises:
(viii) deposition or growth on the front face 21 of the heterojunction 20 of a photon-transparent conductive layer 50 (typically 300 nm-1200 nm of the solar spectrum), and
(ix) the structuring P3 of zones, referred to as second insulating zones p3, isolating the conductive zones of the conductive layer 50;
wherein the first p1, second p2 and third p3 insulating zones are not superimposed in the vertical stacking of layers of the multilayer material 1.

Advantageously, the layers 24 and 26 are structured in step P2.

Advantageously, the layers 24 and 26 are structured in step P3.

According to one variant, the structuring (P2) preferably takes place before the deposition or the growth on the front face 21 of the heterojunction 20 of a conducting layer 50 that is transparent to photons.

Figure 2:
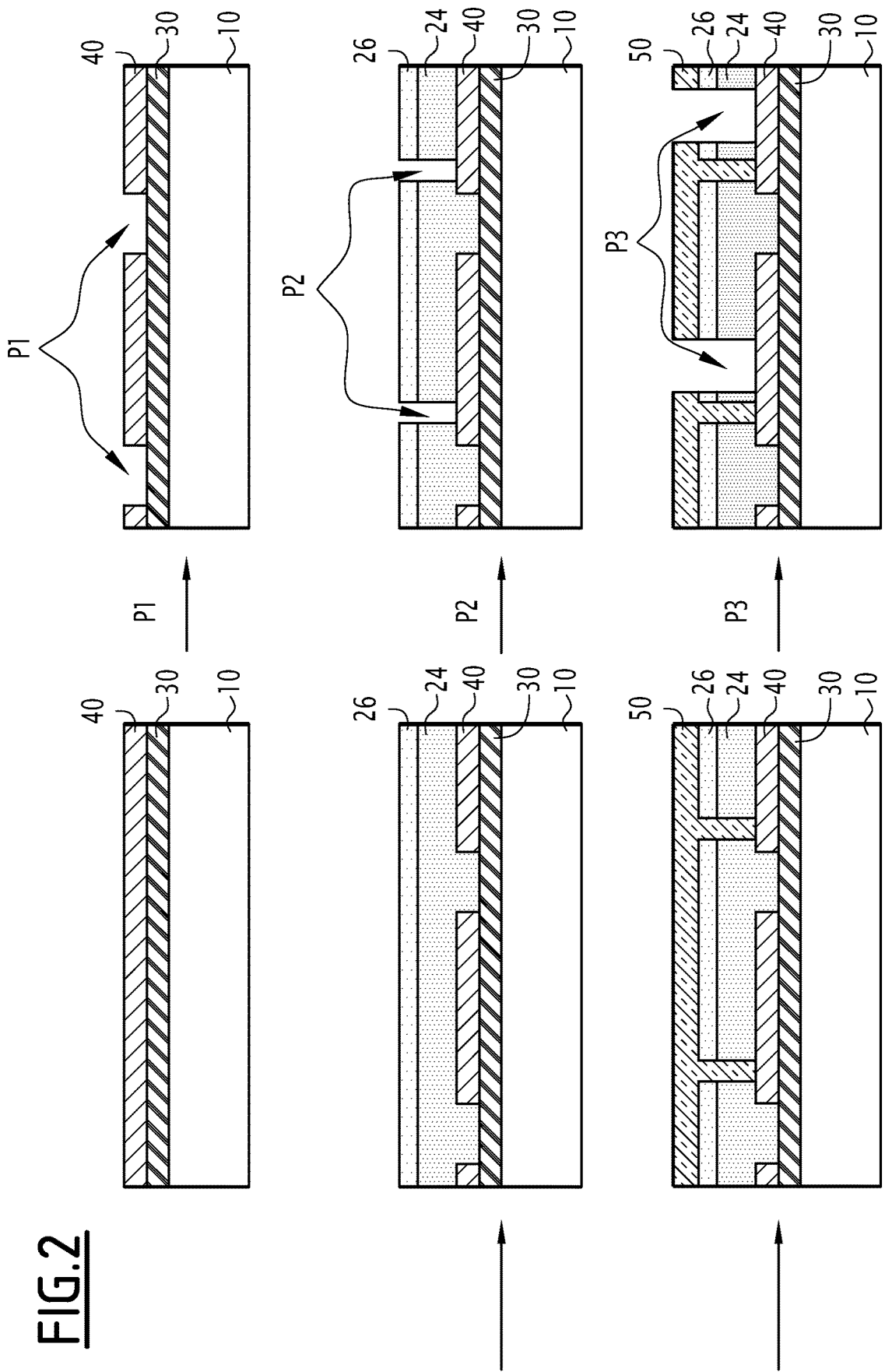
FIG. 2 schematically shows an embodiment of a method of manufacturing a multi-layer material according to the present invention.

According to one embodiment, for example illustrated in FIG. 2, the method comprises the preparation of a tandem cell, wherein the method comprises the preparation of a back-contact monocrystalline silicon photovoltaic cell, the deposition of an insulating layer 30 by epitaxial growth on the front face of the monocrystalline silicon 10, the deposition of a rear contact layer 40 by epitaxial growth on the front face 31 of the insulating layer 30, the structuring P1 in the grooves of the rear contact layer 40, the deposition of a layer of a first material 24 by epitaxial growth forming a first layer of a heterojunction 20, the deposition of a layer of a second material 26 (by epitaxial growth or not, as for example in the case of CIGS and perovskites) forming a second layer of the heterojunction 20 on the layer of the first material 24, the structuring P2 in grooves of the layers of the first material 24 and the second material 26, the deposition of a front contact layer 50 of a transparent conductive material, the structuring P3 in grooves of the front contact layer 50 and the layers of the first material 24 and the second material 26, the deposition of a protection of the front face of the tandem cell, for example by a layer of glass.

Figure 3:
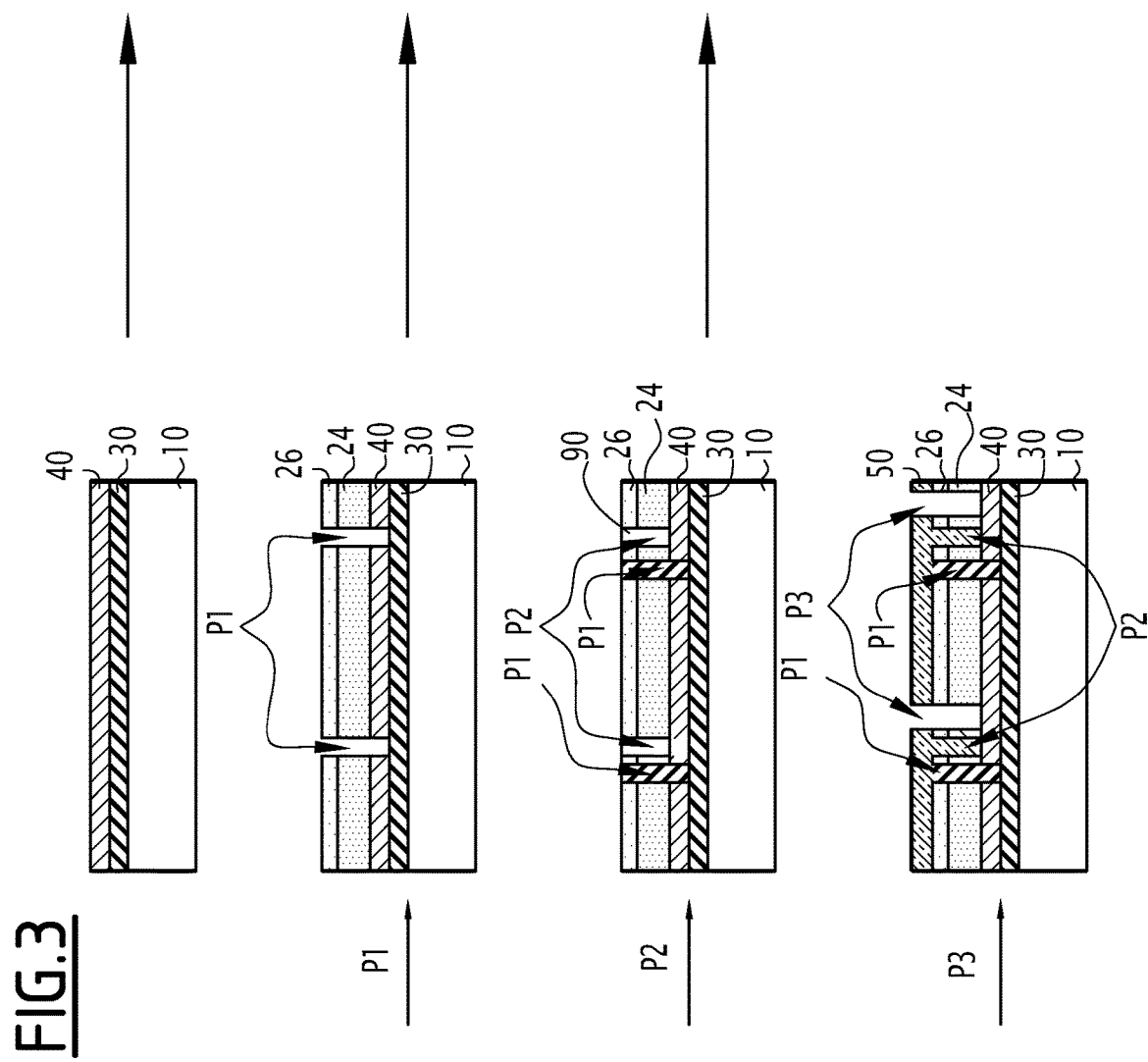
FIG. 3 schematically shows an embodiment of a method of manufacturing a multi-layer material according to the present invention.

According to one embodiment, for example illustrated in FIG. 3, the method comprises the preparation of a tandem cell, wherein the method comprises the preparation of a back-contact monocrystalline silicon photovoltaic cell, the deposition of an insulating layer 30 by epitaxial growth on the front face of the monocrystalline silicon 10, the deposition of a back contact layer 40 by epitaxial growth on the front face 31 of the insulating layer 30, the deposition of a layer of a first material 24 by epitaxial growth to form a first layer of a heterojunction 20, the deposition of a layer of a second material 26 (by epitaxial growth or not, as in the case of CIGS and perovskites) to form a second layer of the heterojunction 20 on the layer of the first material 24, and, once these layers are finished, the structuring P1 in grooves of the layers of the first material 24 and the second material 26, and the back contact rear layer 40, the structuring P2 in grooves of the layers of the first material 24 and the second material 26, the deposition of a front contact layer 50 of a transparent conductive material, the structuring P3 in grooves of the front contact layer 50 and layers of the first material 24 and the second material 26, the deposition of a protection of the front face of the tandem cell, for example by a glass layer. The structuring P1 in the grooves may be followed by the filling of an electrical-insulating material 90, and preferably transparent in the solar spectrum (typically wavelengths 300 nm-1200 nm), for example of the polymer type.

To easily obtain the monolithic connection, according to one variant, the structurings P1, P2, P3 must be positioned successively and repetitively in this order from left to right or vice versa.

Thus, it is possible to produce an epitaxial insulating layer on the surface of the silicon and then to resume the growth of III-V layers by structuring them in lateral strips so as to make a monolytic connection between the epitaxial bands.

Advantageously, the back contact layer 40 of the junction III-V, or other junctions considered (CIGS, CdTe, Perovskite) has a good electrical conduction in the horizontal plane.

The invention also relates to a multi-layer material 1 obtained according to a manufacturing method as defined according to the invention.

The present invention makes it possible to produce very high efficiency tandem Si III-V cells, preferably by means of a four-wire configuration by epitaxial growth of a III-V junction on a silicon cell with interdigitated back contacts, and the production of a monolithic type connection of the III-V junction.

The present invention may be used for front cells of the III-V, CIGS, CdTe, hybrid perovskite type, or other inorganic multinary materials (chalcogenides, phosphides, arsenides, halides, etc.).

The present invention provides a novel architecture for combining the advantage of epitaxial cells with four-wire configurations, wherein the current epitaxial configuration is limited to the 2-wire type.

Application

The invention also relates to a photovoltaic cell characterized in that it comprises, or consists of, one or more multi-layer materials 1 as defined according to the invention, or obtained by a method as defined according to the invention, and preferably forming a double junction (also called tandem cell).

The invention also relates to a mobile or stationary device comprising an electricity generator and characterized in that the electricity is produced by the implementation of one or more multi-layer materials 1 as defined according to the invention or obtained by a method as defined according to the invention.

The invention also relates to a method for producing electricity from electromagnetic radiation characterized in that one or more multi-layer materials 1 as defined according to the invention, or obtained by a method as defined according to the invention, are exposed to electromagnetic radiation, preferably on the front side 101 and in that an electric current is collected, in particular by interdigitated contact electrodes 60 on the rear side 102.

The invention claimed is:

1. A Multi-layer material comprising:
an assembly of layers, called "front layer assembly" forming a front photovoltaic cell comprising at least one combination of layers of a first material and of a second material forming an heterojunction comprising a chalcogenide or perovskite layer, and a back contact layer of a III-V semiconductor compound; and
an assembly of layers, called "rear layer assembly" forming a rear photovoltaic cell comprises at least monocrystalline silicon,
wherein the front layer assembly and the rear layer assembly are electrically insulated by an insulating layer of epitaxial material, and form a tandem photovoltaic cell having a vertical stacking of said silicon cell and said heterojunction comprising at least a chalcogenide or perovskite layer and said back contact layer of a III-V semiconductor compound, wherein said chalcogenide or perovskite layer is epitaxial.

2. The Multilayer material according to claim 1, wherein the front layer assembly comprises at least one combination of heterojunction layers comprising a first material and a second material, a back contact layer, and a front contact layer.

3. The Multilayer material according to claim 1, wherein said chalcogenide layer is a CIGS or CdTe layer.

4. The Multi-layer material according to claim 1, wherein the insulating layer is epitaxially grown.

5. The Multi-layer material according to claim 1, wherein the insulating layer comprises, or consists of, aluminum nitride (AlN) and/or phosphide of aluminum (AlP), and/or any of the alloys comprising AlN or AlP, or $Gd_2O_3$, $Al_2O_3$ or $(Ba,Sr)TiO_3$.

6. The Multi-layer material according to claim 1, wherein the front layer assembly comprises at least one combination of heterojunction layers comprising a first material and a second material and wherein the heterojunction comprises vertical semiconductor compounds type of the CIGS $(Cu, Ag)(In,Ga,Al),(S,Se)_2)$ type.

7. The Multi-layer material according to claim 1, wherein the front layer assembly comprises at least one combination of heterojunction layers comprising a first material and a second material and in that the first material and the second material are connected in series monolithically.

8. The Multi-layer material according to claim 1, wherein multi-layer material comprises a layer of at least one monocrystalline silicon having a front face and a rear face, wherein the rear face comprises interdigitated contact electrodes.

9. The Multi-layer material according to claim 1, wherein the front layer assembly comprises at least one combination of heterojunction layers comprising a first material and a second material, wherein the multi-layer material comprises a layer comprising a front face and a face rear, referred to as the front contact of the heterojunction, wherein the rear face is in contact with the front face of the heterojunction, wherein the front contact layer comprises a transparent conductive material, and wherein the rear face of the heterojunction and the front contact layer are alternately in contact with the back contact layer.

10. The Multilayer material according to claim 1, wherein said multilayer material forms a front junction with a monolithic type interconnection associated with a silicon structure.

11. The Multi-layer material according to claim 1, wherein the rear layer assembly, the front layer assembly, the electrically-insulating layer, and, optionally the intermediate layer(s) between these layers, form a combination of monocrystalline layers.

12. The Multi-layer material according to claim 1, wherein the front layer assembly comprises a photon-transparent, conductive layer on the front side of the heterojunction.

13. The Multi-layer material according to claim 1, wherein the multi-layer material forms a 4-wire tandem photovoltaic cell.

14. The Multi-layer material according to claim 1, wherein the multi-layer material comprises a horizontal alternation of type III-V semiconductor compounds combined with CIGS.

15. A Method of manufacturing a multi-layer material according to claim 1.

16. The Method according to claim 15, wherein the method comprises consecutively:
(i) preparing a monocrystalline silicon having a front face and a rear face;
(ii) depositing or growing an electrically-insulating layer on the front face of the monocrystalline silicon, wherein the insulating layer has a front face and a rear face;
(iii) deposition or growth on the front face of the insulating layer of a layer, comprising a front face and a rear face, referred to as the rear contact face, a heterojunction, wherein the front face is in contact with the rear face of the heterojunction;
- (iv) deposition or growth on the front face of the back contact layer of a layer of a first material of a heterojunction, and then deposition or growth of a layer of a second material, wherein the heterojunction comprises a front face and a rear face; and
- (v) the structuring (P1) of zones, referred to as the first insulating zones (p1) isolating the conductive zones of the back contact layer, wherein the structuring (P1) forms alternative contacts on the front face of the electrically-insulating layer with the back layer of the heterojunction and the rear face of the heterojunction;

wherein the electrically-insulating layer is arranged between the rear face of the back contact layer of the heterojunction and the front face of the monocrystalline silicon.

17. The Method according to claim 16, wherein the method comprises:
- (vi) the structuring (P2) of zones, referred to as second insulating zones (p2), isolating semiconductor regions of the heterojunction;

wherein the first (p1) and second (p2) insulating zones are not superimposed in the vertical stacking of layers of the multilayer material.

18. The Method according to claim 16, wherein the method comprises:

- (viii) the deposition or growth on the front face of the heterojunction of a conductive photon-transparent layer, and
- (ix) the structuring (P3) of zones, referred to as third insulating zones (p3), isolating conductive layer conductive zones;

wherein the first (p1), second (p2) and third (p3) insulating zones are not superimposed in the vertical stacking of layers of the multilayer material.

19. A photovoltaic cell comprising one or more multi-layer materials as defined according to claim 1, or obtained by a method as defined according to claim 16 forming a double junction called tandem cell.

20. A mobile or stationary device comprising an electricity generator and wherein the electricity is produced by the implementation of one or more multi-layer materials as defined in claim 1, or obtained by a method as defined in claim 16.

21. A method of producing electricity from electromagnetic radiation wherein one or more multi-layer materials as defined in claim 1, or obtained by a method such as defined according to claim 16, are exposed to electromagnetic radiationand in that an electric current is collected.

22. The Method according to claim 21, wherein said electric current is collected by interdigitated contact electrodes on the rear side.

* * * * *